US009713286B2

(12) United States Patent
Chainer et al.

(10) Patent No.: US 9,713,286 B2
(45) Date of Patent: Jul. 18, 2017

(54) ACTIVE CONTROL FOR TWO-PHASE COOLING

(71) Applicant: INTERNATIONAL BUSINESS MACHINES CORPORATION, Armonk, NY (US)

(72) Inventors: Timothy J. Chainer, Putnam Valley, NY (US); Pritish R. Parida, Stamford, CT (US); Joel A. Silberman, Somers, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/636,648

(22) Filed: Mar. 3, 2015

(65) Prior Publication Data
US 2016/0262288 A1 Sep. 8, 2016

(51) Int. Cl.
H05K 7/00 (2006.01)
H05K 7/20 (2006.01)
F28D 15/02 (2006.01)
F28D 15/06 (2006.01)

(52) U.S. Cl.
CPC ....... H05K 7/20381 (2013.01); F28D 15/025 (2013.01); F28D 15/0266 (2013.01); F28D 15/06 (2013.01); H05K 7/20327 (2013.01); H05K 7/20336 (2013.01);
(Continued)

(58) Field of Classification Search
None
See application file for complete search history.

(56) References Cited

U.S. PATENT DOCUMENTS 3,635,082 A  1/1972  Prellwitz et al.
4,841,224 A  6/1989  Chalupnik et al.
5,052,897 A  10/1991 Yamashita et al.
(Continued)

FOREIGN PATENT DOCUMENTS

CN  103323502 A  9/2013
EP    0239703 B1  6/1991

OTHER PUBLICATIONS

Matsumoto, K. et al. "Experimental thermal resistance evaluation of a three-dimensional (3D) chip stack, including the transient measurements," Semiconductor Thermal Measurement and Management Symposium (SEMI-THERM), Mar. 2012, 28th Annual IEEE DOI: 10.1109/STHERM.201206188819. pp. 8-13.
(Continued)

Primary Examiner — Courtney Smith
Assistant Examiner — Zhengfu Feng
(74) Attorney, Agent, or Firm — Tutunjian & Bitetto, P.C.; Daniel P. Morris

(57) ABSTRACT

Methods and devices for active control for two-phase cooling include a cooling volume that has cavities and active coolant flow controls in the cavities configured to adjust coolant flow through the cavities. A reservoir in fluid communication with the cavities and there is a two-phase coolant in the reservoir and cavities. The two-phase coolant has a phase transition temperature between an ambient temperature and an expected device temperature. A coolant sensor is configured to determine a coolant phase condition in the cavities. A control module is configured to adjust the active coolant flow controls in response to the determined coolant phase condition.

7 Claims, 8 Drawing Sheets

(52) U.S. Cl.
CPC ..... *H05K 7/20809* (2013.01); *H05K 7/20827* (2013.01); *H05K 7/20836* (2013.01)

(56) References Cited

U.S. PATENT DOCUMENTS

| | | | |
|---|---|---|---|
| 5,861,755 | A | 1/1999 | Moerk et al. |
| 6,776,029 | B2 | 8/2004 | Hotta et al. |
| 7,015,572 | B2 | 3/2006 | Yamaji |
| 7,696,015 | B2 | 4/2010 | Kim et al. |
| 7,990,711 | B1 | 8/2011 | Andry et al. |
| 8,651,172 | B2 * | 2/2014 | Wyatt ................ F25B 23/006 165/104.21 |
| 8,766,433 | B2 | 7/2014 | Avenas et al. |
| 2004/0069051 | A1 | 4/2004 | Hotta et al. |
| 2004/0182172 | A1 * | 9/2004 | Richards ................ G01F 1/74 73/861.04 |
| 2006/0186899 | A1 | 8/2006 | Gold et al. |
| 2009/0058428 | A1 | 3/2009 | Reich et al. |
| 2010/0290190 | A1 * | 11/2010 | Chester ............ H05K 7/20772 361/701 |
| 2011/0296855 | A1 * | 12/2011 | Johnston ............ B60L 3/0046 62/79 |
| 2011/0317367 | A1 * | 12/2011 | Campbell .......... H05K 7/20809 361/700 |
| 2012/0181884 | A1 | 7/2012 | Fulton et al. |
| 2013/0044431 | A1 | 2/2013 | Koeneman |
| 2013/0048264 | A1 * | 2/2013 | Lu ........................ G05D 23/00 165/287 |
| 2013/0074525 | A1 * | 3/2013 | Johnston ............ B60H 1/00278 62/56 |
| 2013/0092938 | A1 | 4/2013 | Knickerbocker et al. |
| 2013/0099368 | A1 | 4/2013 | Han |
| 2013/0105122 | A1 * | 5/2013 | Campbell .............. H05K 7/203 165/104.26 |
| 2014/0071628 | A1 | 3/2014 | Brunschwiler et al. |
| 2014/0078672 | A1 | 3/2014 | Brunschwiler et al. |
| 2015/0062806 | A1 * | 3/2015 | Shelnutt ................ H05K 7/203 361/679.53 |
| 2015/0160147 | A1 * | 6/2015 | De Paepe .......... G01N 33/2823 165/276 |

OTHER PUBLICATIONS

Office Action for U.S. Appl. No. 14/748,074 dated Apr. 14, 2017 (7 pages).

* cited by examiner

ACTIVE CONTROL FOR TWO-PHASE COOLING

STATEMENT REGARDING FEDERALLY SPONSORED RESEARCH OR DEVELOPMENT

This invention was made with Government support under (FA8650-14-C-7466) awarded by (Defense Advanced Research Projects Agency (DARPA). The Government has certain rights to this invention.

BACKGROUND

Technical Field

The present invention relates to cooling systems and, more particularly, to active control of two-phase cooling systems taking advantage of changing electrical properties between coolant phases.

Description of the Related Art

In typical air-cooling environments, a processor core generates heat which is conducted through a thermal interface material (TIM) to a heat-spreader, typically made of copper. The heat spreader is attached to an air heat sink through a second TIM layer, and the heat sink conducts heat to the room ambient environment. In data centers, the ambient temperature is typically around 25 degrees Celsius. The total thermal resistance for a typical air cooled server is approximately 0.24 C/W, which for a 250 W processor results in a 60 degree Celsius temperature gradient between the ambient temperature and the processor core. This would result in a core temperature of 85 degrees Celsius.

Liquid cooling systems, and two-phase cooling systems in particular, can lower the thermal resistance substantially, thereby reducing the junction temperature. This minimizes processor power consumption at a given computational throughput. Generally, single or two-phase heat transfer involving small cavity channels leads to a larger heat transfer surface per unit flow area near the heat source when compared with large channel or pool-boiling approaches. However, two-phase liquid cooling systems can experience difficulties as they may, for example, dry out under heavy computational loads.

SUMMARY

A cooling device includes a cooling volume that has cavities and active coolant flow controls in the cavities configured to adjust coolant flow through the cavities. A reservoir is in fluid communication with the cavities and a two-phase coolant is in the reservoir and cavities. The two-phase coolant has a phase transition temperature between an ambient temperature and an expected device temperature. A coolant sensor is configured to determine a coolant phase condition in the cavities. A control module is configured to adjust the active coolant flow controls in response to the determined coolant phase condition.

A cooling system includes a device to be cooled and a cooling device integrated with the device to be cooled. The cooling device includes a cooling volume that has cavities and active coolant flow controls in the cavities configured to adjust coolant flow through the cavities, a reservoir in fluid communication with the cavities comprising a liquid outlet and an inlet for a gas or gas-liquid mixture, a two-phase coolant in the reservoir and cavities, wherein the two-phase coolant has a phase transition temperature between an ambient temperature and an expected device temperature, and a capacitance sensor configured to determine a coolant capacitance in the cavities. A control module is configured to determine a vapor quality and void fraction of the coolant based on the measured capacitance and to increase coolant flow if the determined vapor quality and void fraction indicate a dry-out condition. A secondary cooling line removes heat from the cooling device.

A method for coolant control includes measuring a coolant phase condition in a cavity in a heat-generating device. The coolant phase condition is compared to a threshold to determine whether coolant flow should be adjusted. Coolant flow is adjusted in accordance with the determination.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention provide controllable cooling for two-phase cooling systems. Intrachip two-phase evaporative cooling is used to minimize thermal resistance and achieve a lower temperature gradient between a chip junction and the local refrigerant temperature. Latent heat in flow boiling mitigates the issue of junction temperature increases across the chip when compared to a single-phase liquid cooling solution. In addition, the present embodiments address difficulties with heat flux, heat density, total heat, and hot spot migration.

The present embodiments employ electrical sensing to determine a cooling rate and fluid volume within a cooling device. By exploiting a change in capacitance between a liquid phase and a gaseous phase, the volume of each phase in a cooling element can be determined. Based on this information, a rate of coolant flow can be adapted to respond to changing conditions. For example, if the cooling element contains mostly gas, then additional coolant is needed to prevent the cooling element from drying out.

Figure 1:
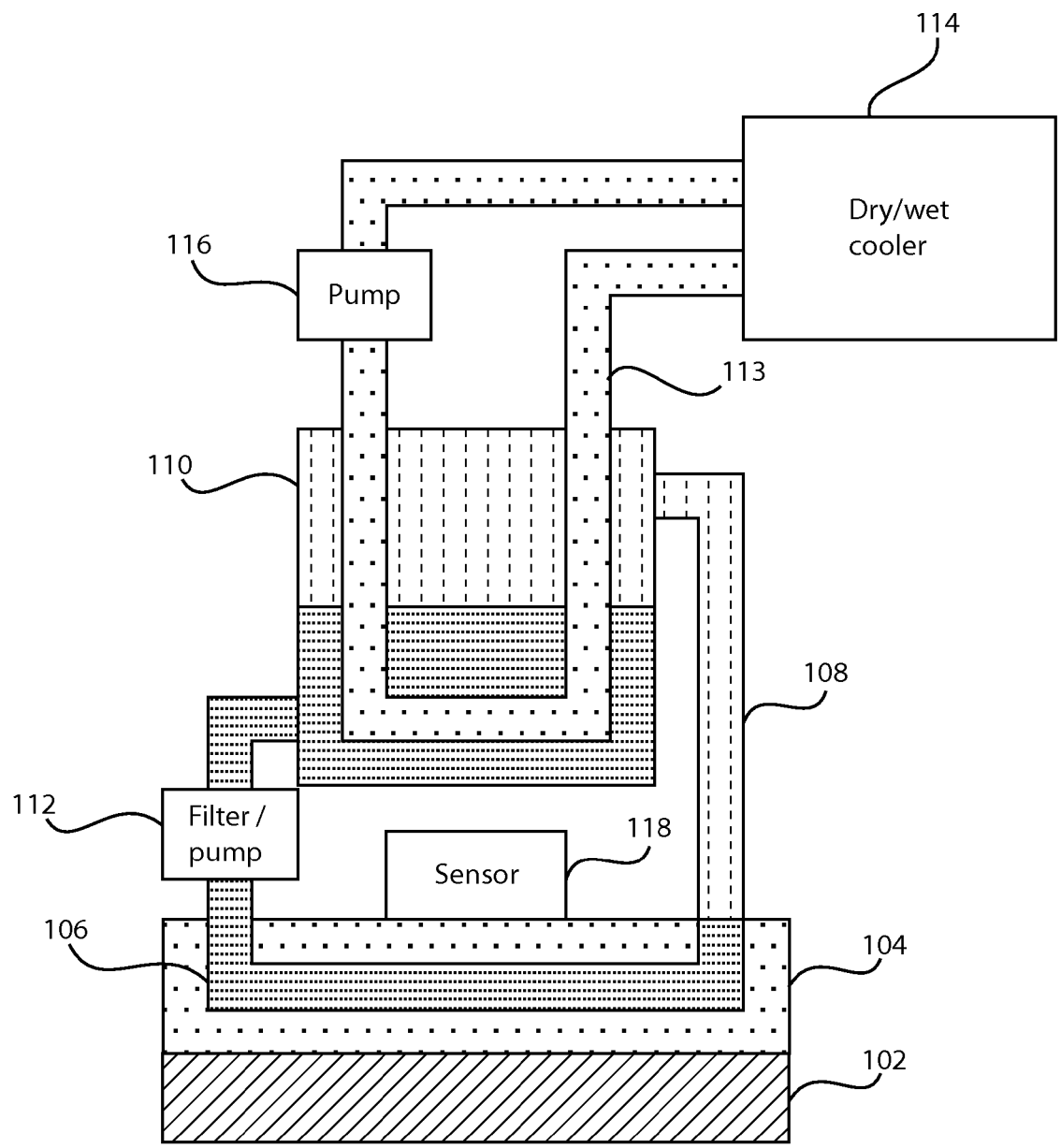
FIG. 1 is a diagram of an active two-phase cooling system in accordance with the present principles.

Referring now to the drawings in which like numerals represent the same or similar elements and initially to FIG. 1, a diagram of a cooling system is shown. A device 102 generates heat during use. A heat sink 104 is formed on the device 102, either by mounting the heat sink 104 on a surface of the device 102 or by forming the heat sink 104 integrally with the device 102. The heat sink 104 includes one or more channels through which liquid coolant 106 flows. As the coolant 106 is heated, it changes state to a gaseous form 108, which rises out of the heat sink 104 and enters a condenser/reservoir 110. The gaseous coolant 108 cools in the condenser 110 and changes back to a liquid state 106, dropping down into the reservoir. A filter/pump 112 moves liquid from the reservoir 110 to the heat sink 104. A sensor 118 measures an electrical property of the coolant 106, such as the capacitance, to be used in adjusting coolant flow.

The condenser/reservoir 110 is, in turn, cooled by a separate cooling system and forms a liquid-to-liquid heat exchange with liquid coolant 113. The second coolant 113 takes heat from the first coolant 106 and removes it to a dry/wet cooler 114. Pump 116 then pumps the cooled second coolant 113 into the condenser/reservoir 110 again.

It should be understood that the two-phase coolant 106 may represent any appropriate two-phase coolant having a phase transition temperature that is between an ambient temperature and an expected operating temperature of the device 102. In particular, it is contemplated that R1234ze may be used. The second coolant 113, meanwhile, should be in its liquid state at both the ambient temperature and at the chip's operating temperature. For many applications, distilled water is an appropriate coolant for this purpose.

In data centers, the ambient temperature is typically around 25 degrees Celsius. The total thermal resistance for a conventional air-cooled server is approximately 0.24 C/W, which for a 250 W processor would result in a 60 degree temperature gradient between the ambient temperature and the processor core. This results in a core temperature of about 85 degrees Celsius. Embodiments of the present invention lower the thermal resistance to about 0.04 C/W or less, thereby reducing the junction temperature and minimizing processor power consumption at a similar computational throughput. A two-phase heat transfer involving small cavity channels in the heat sink 104 provides a large heat transfer surface per unit of flow area near the heat source as compared to large-channel or pool boiling techniques.

Lower thermal resistance enables year-round outdoor ambient cooling of the data center, thereby reducing the cooling energy needed to transfer the chip heat to the outdoor ambient environment. In the embodiment of FIG. 1, the primary closed refrigerant loop transfers heat from the device 102 to a secondary liquid loop, which in turn transfers heat to the dry/wet cooler 114 to dissipate heat to the outdoor ambient environment. If the temperature of the coolant in the secondary loop is sufficiently high, the heat can be recovered, resulting in further improvements in system efficiency. Compared to a baseline air cooled system, the present embodiments enable up to 20× reductions in cooling energy. Cooling power can be further optimized by implementing dynamic control at the chip module level.

Figure 2:
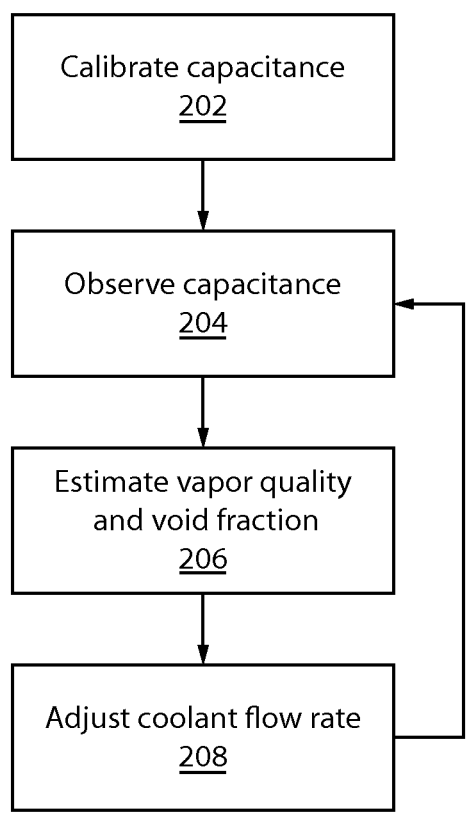
FIG. 2 is a block/flow diagram of a method for coolant flow control in accordance with the present principles.

Referring now to FIG. 2, a method for active control of a two-phase cooling system is shown. Block 202 calibrates for the capacitance of the coolant 106 in the presence of liquid state and vapor state coolant. The dielectric constant for a given material in its liquid phase is substantially different from the dielectric constant of the same material in its vapor phase. Hence, vapor quality (the mass fraction of a saturated mixture that is vapor) and void fraction (the fraction of the volume or cross sectional area of a channel that is occupied by the gas phase) can be determined for different measured dielectric constants of the coolant 106. Calibration in block 202 involves measurement of capacitance while varying the liquid and vapor phase temperatures, as well as the amount of vapor and liquid in a capacitor.

Block 204 then measures the actual capacitance with sensor 118. Block 206 estimates vapor quality and void fraction based on the measured capacitance, providing information regarding how much of the coolant 106 in the heat sink 104 is in its gaseous state. Block 208 then makes any adjustments to the coolant flow needed by adjusting the pumping rate of the pump 112. Adjustments may include redistributing flow through the heat sink 104 and adjusting workloads in the device 102 to regulate heat dissipation. This process is repeated, with measurements and adjustments being made as needed to respond to changing cooling conditions. It should be noted that the relationship between void capacity, vapor quality, and capacitance is empirically determined, as it depends on how and where the capacitive sensors are located. The geometry of channel features and the dielectric constant also affect the capacitive sensor.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 3:
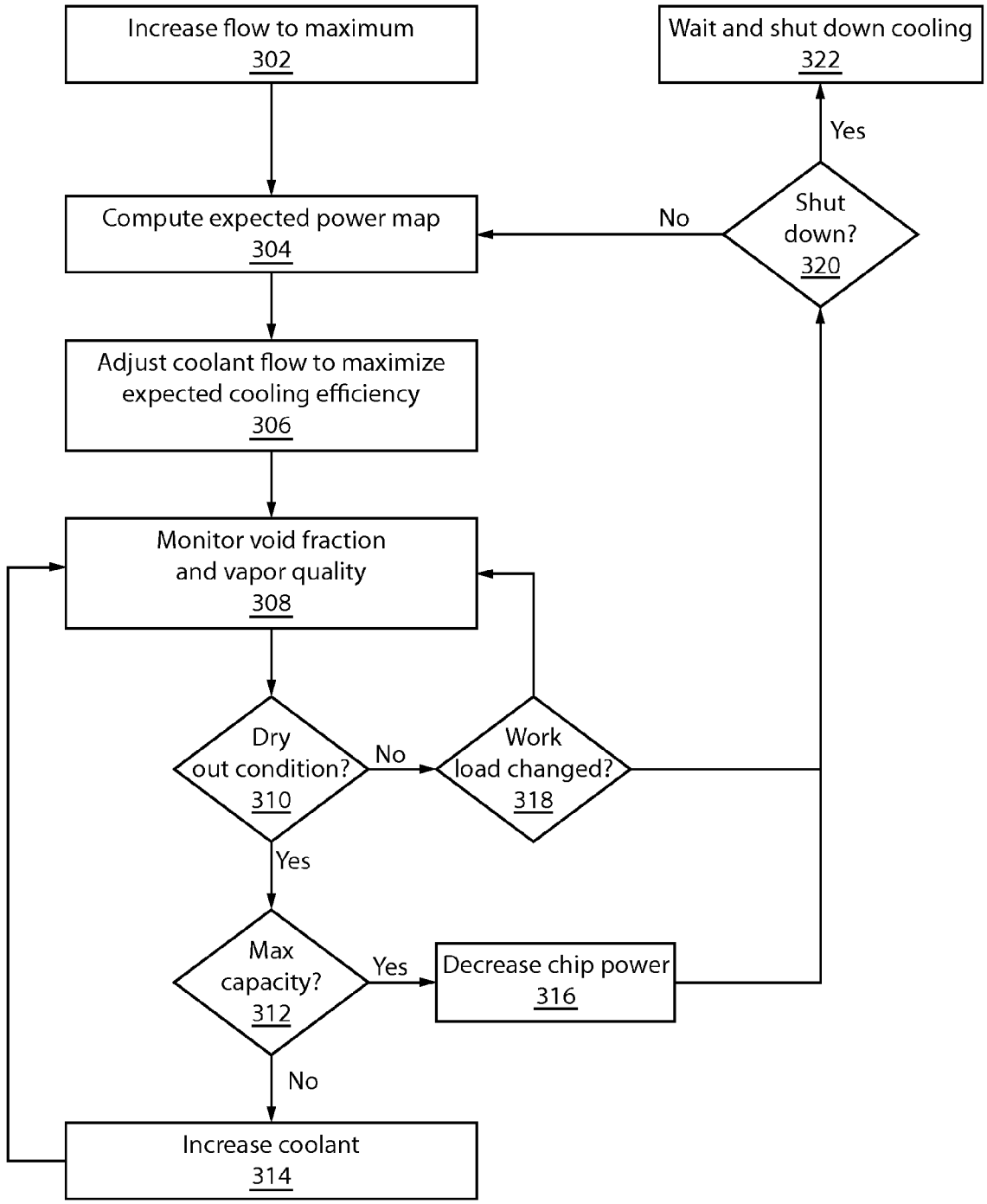
FIG. 3 is a block/flow diagram of a method for coolant flow control in accordance with the present principles.

Referring now to FIG. 3, a detailed method for coolant flow adjustment is shown. The system begins at block 302 with a maximum coolant flow through the heatsink 104. Block 304 considers the first workload to be executed and computes an expected power-map for how the workload is to be executed across the one or more processing cores of the device 102. Block 306 then adjusts coolant flow through the heatsink 104 to maximize the expected cooling efficiency. This is accomplished by adjusting active components, including the pump 112 as well as active components within the heatsink 104 itself.

Block 308 monitors void fraction and vapor quality in the coolant 106 using, e.g., capacitive sensing at sensor 118. Block 310 uses the monitored coolant information to determine whether the coolant 106 is drying out. If the coolant is drying out, block 312 determines whether the coolant flow is already at maximum capacity. Block 314 increases coolant flow to the device 102 if additional capacity is available, but if not, block 316 decreases chip power to lower coolant needs.

In one case, chip power may need to be decreased to a shutdown point. Furthermore, if there is no dry out condition, but the workload is changing at block 318, one option is for the workload to end and for device chip to shut down. Block 320 determines whether a shutdown condition is indicated. If so, block 322 waits a predetermined period of time for the device 102 to cool and then shuts down coolant flow. Otherwise, processing returns to block 304 to compute a new expected power map for the changed workload.

Figure 4:
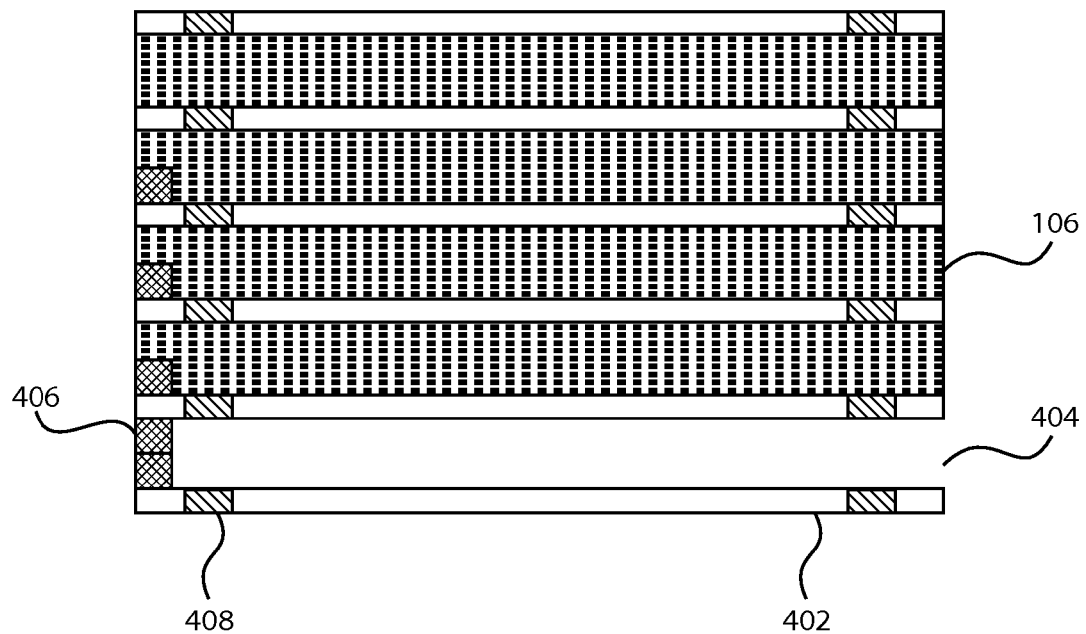
FIG. 4 is a diagram of channels within a cooling device in accordance with the present principles.

Referring now to FIG. 4, a top-down view of channels 404 in the heatsink 104 is shown. The channels 404 are defined by channel walls 402 and allow the flow of coolant 106. Also present are active controls 406 which can partially or completely obstruct a channel 404 to adjust the rate of flow for coolant 106 through the channels 404. It should be understood that the active controls 406 may be movable components based on, for example, micro electro-mechanical systems (MEMS) or piezo-electric devices. In the case of piezo-electric active controls 406, moveable components change position or orientation by applying a voltage. Using such devices, the effective cross-section for flow inside the channel can be altered. A smaller cross-section means a higher resistance to flow. Sensors 408 are positioned on, in, or around the channel walls 404 to detect vapor quality and void fraction of the coolant 106 within the channels 404.

Figure 5:
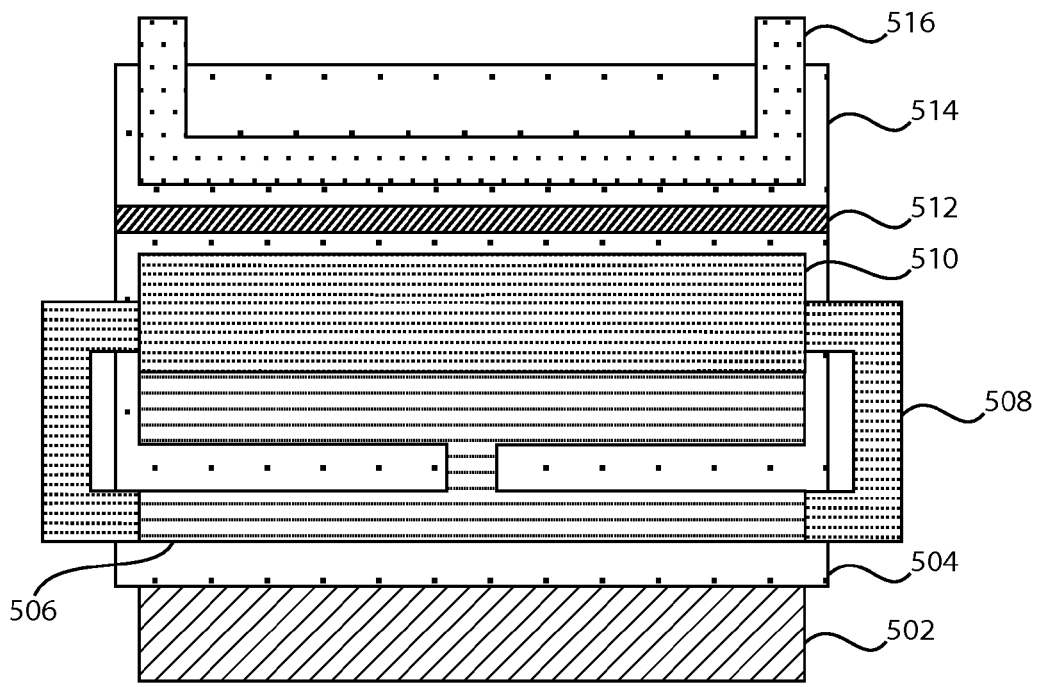
FIG. 5 is a diagram of a field-replaceable cooling device in accordance with the present principles.

Referring now to FIG. 5, an alternative embodiment is shown that provides additional field-replacement capability. Replacing the heatsink 104 in the embodiment of FIG. 1 would involve breaking connections between the heatsink 104 and the condenser/reservoir 110. A modified heatsink/reservoir 504 is therefore formed either as part of the processing device 502 or is bonded to the processing device 502. A two-phase coolant is used to cool the device 502, with its liquid phase 506 passing along channels near the device's surface. As above, the liquid coolant 506 converts to a gaseous phase 508 as it is heated. The gaseous coolant 508 collects in condenser/reservoir 510, where it returns to its liquid state and is recirculated. The heatsink 504 may include one or more pumps (not shown), either mounted internally in the reservoir 510 or mounted inside a lid, in the periphery of the lid, or on the outside of the heatsink 504. The pump may be, for example a diaphragm or syringe type pump.

Wicking structures may be used in cavities of the heat sink 504 to wick liquid coolant 506 and to keep channel surfaces wetted. If the characteristic length scale of the wicking structures is small enough, the wicking force will be sufficient to circulate the coolant. The wicking structures enable a thin liquid film over the channel surface leading to thin film evaporation when heat is applied. The vapors 508 thus formed will move to the center of the channels and will travel to the periphery before rising to the top of the lid. Vapor escape is aided by isolating the vapor path from the liquid flow feed path.

The heatsink 504 is thermally connected to a secondary cooling system 514 by a thermal interface material 512. The secondary cooling system 514 may employ any appropriate cooling technology, including for example a liquid coolant 516 and a wet/dry cooler as shown above in FIG. 1.

Figure 6:
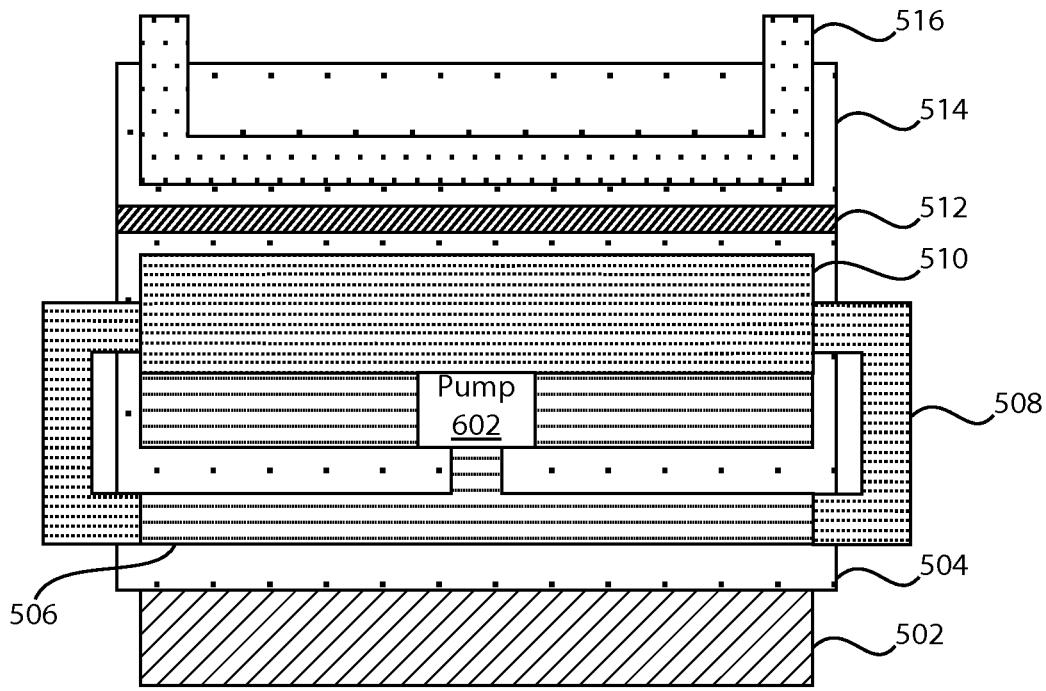
FIG. 6 is a diagram of a field-replaceable cooling device having an embedded pump in accordance with the present principles.

Referring now to FIG. 6, an embodiment is shown having an embedded pump 602. The embedded pump 602 is located between the reservoir 510 and the channels of the heatsink 504 and forces liquid coolant 506 into the channels. A wicking structure may be used in the channels to move coolant 506 material in addition to the pump 602.

Figure 7:
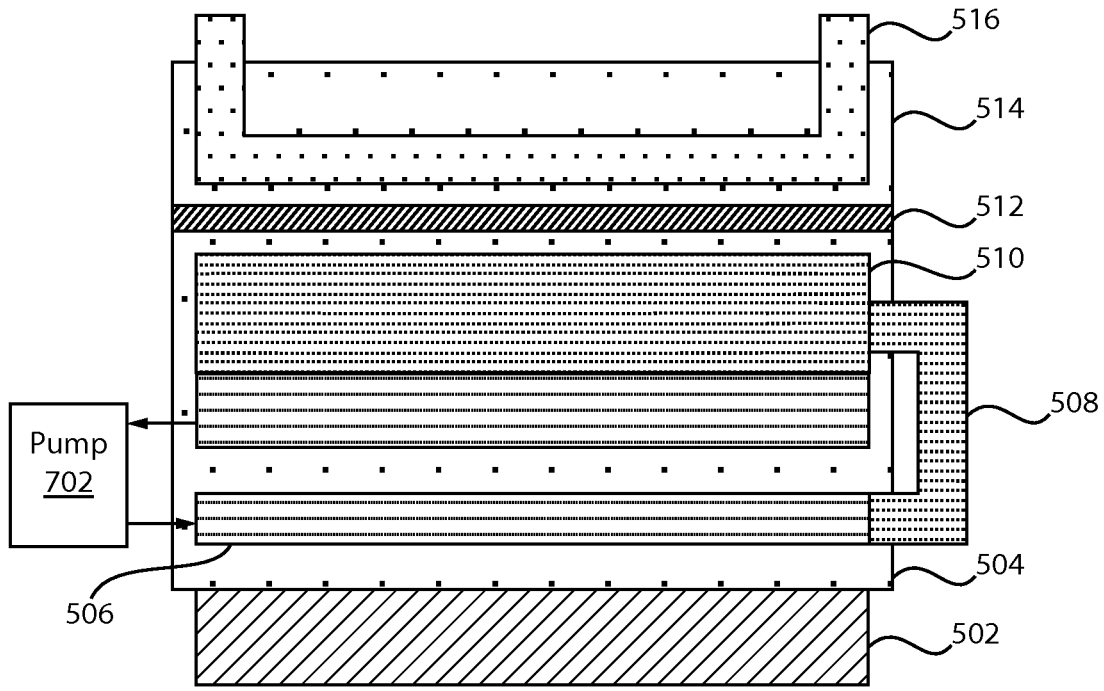
FIG. 7 is a diagram of a field-replaceable cooling device having an external pump in accordance with the present principles.

Referring now to FIG. 7, an embodiment is shown having an external pump that removes liquid coolant 506 from the reservoir and provides it directly to the channels of the heatsink 504. A wicking structure may be used in the channels to move coolant 506 material in addition to the pump 702.

Figure 8:
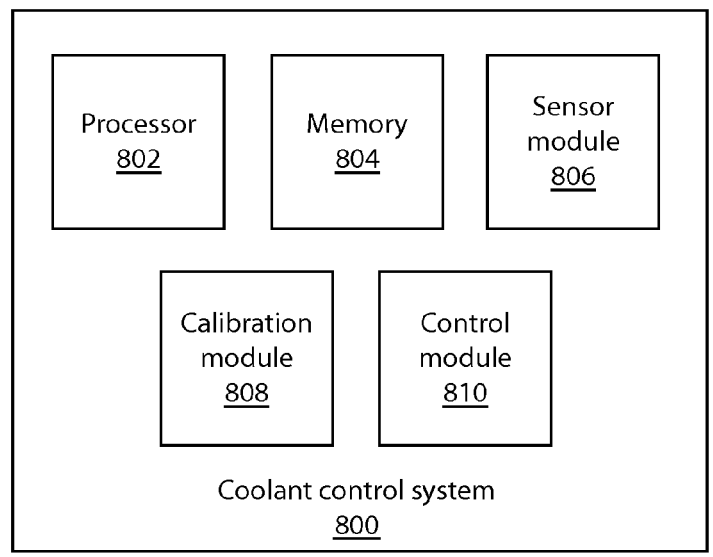
FIG. 8 is a block diagram of a coolant control system in accordance with the present principles.

Referring now to FIG. 8, a coolant control system 800 is shown. The control system 800 includes a processor 802 and memory 804 to store and implement coolant control information. A sensor module 806 receives information from the sensors 118, which allows processor 802 to determine vapor quality and void fraction in accordance with calibration information stored in memory 804 by the calibration module 808. Based on these quantities, the processor 802 determines whether to increase or decrease coolant flow and signals the pump 112, 602, or 702 and the active controls 406 to adjust coolant flow accordingly.

Figure 9:
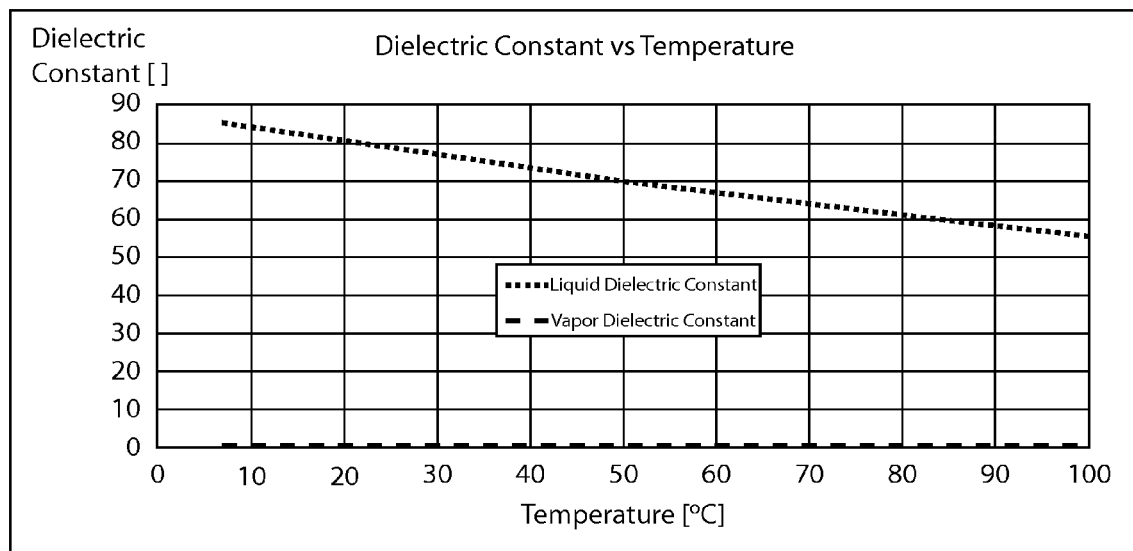
FIG. 9 is a graph of dielectric constant versus temperature in an exemplary coolant in accordance with the present principles.

Referring now to FIG. 9, a graph is shown that illustrates the relationship between temperature on the horizontal axis and dielectric constant on the vertical axis for an exemplary water-based coolant. There is a significant difference between the dielectric constants of the vapor and the liquid across the entire temperature range.

Figure 10:
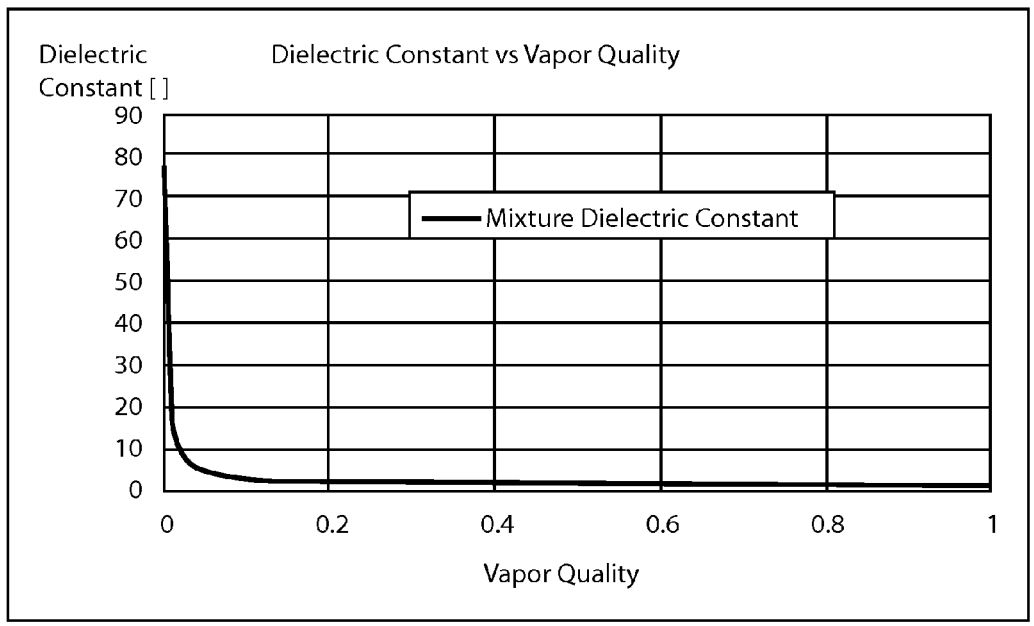
FIG. 10 is a graph of dielectric constant versus vapor quality in an exemplary water-based coolant in accordance with the present principles.

Referring now to FIG. 10, a graph is shown that illustrates the relationship between the vapor quality on the horizontal axis and the dielectric constant on the vertical axis of a water-based coolant. In this case, the dielectric constant drops off sharply with an increase in vapor quality.

Figure 11:
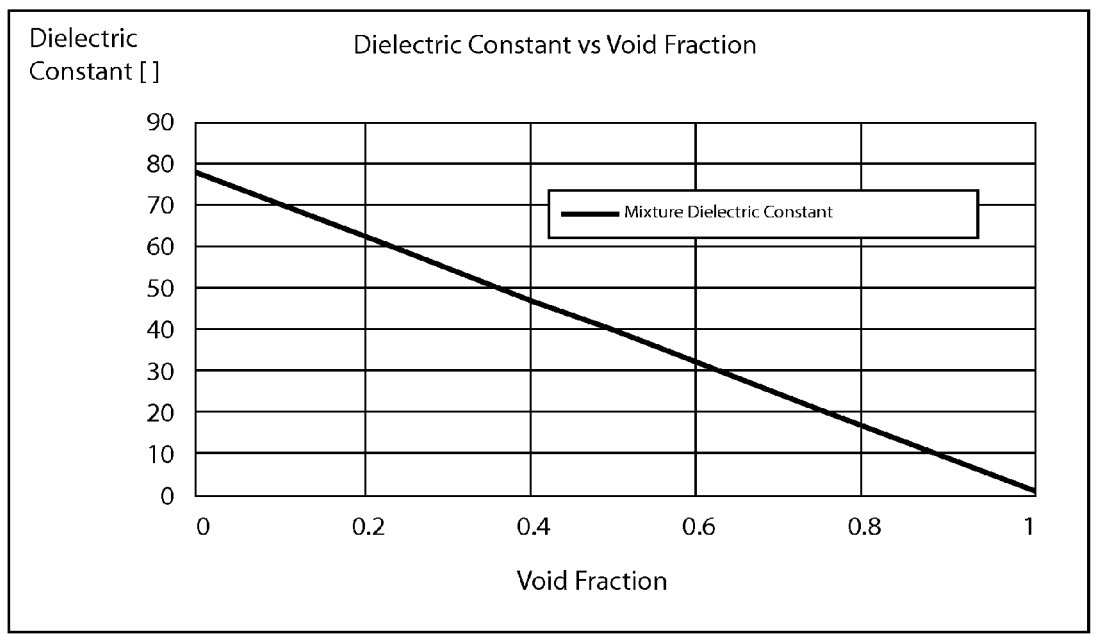
FIG. 11 is a graph of dielectric constant versus void fraction in an exemplary water-based coolant in accordance with the present principles.

Referring now to FIG. 11, a graph is shown that illustrates the relationship between the void fraction on the horizontal axis and the dielectric constant on the vertical axis of a water-based coolant. With a continuous curve across a wide range of values for the dielectric constant, this measurement provides a good way to determine the void fraction of the coolant.

Figure 12:
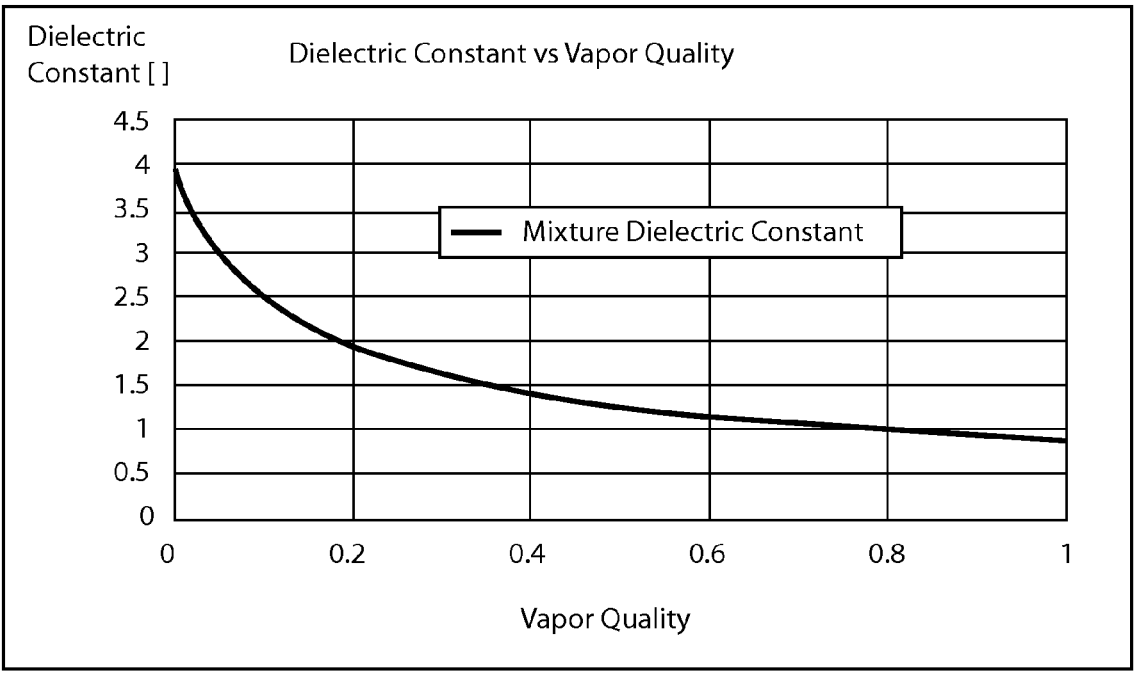
FIG. 12 is a graph of dielectric constant versus vapor quality in an exemplary dielectric coolant in accordance with the present principles.

Referring now to FIG. 12, a graph is shown that illustrates the relationship between the vapor quality on the horizontal axis and the dielectric constant on the vertical axis of a dielectric coolant such as, e.g., R245fa and R1234ze. The curve is less steep than for water, such that the vapor quality relationship can be used across the entire range of vapor qualities.

Figure 13:
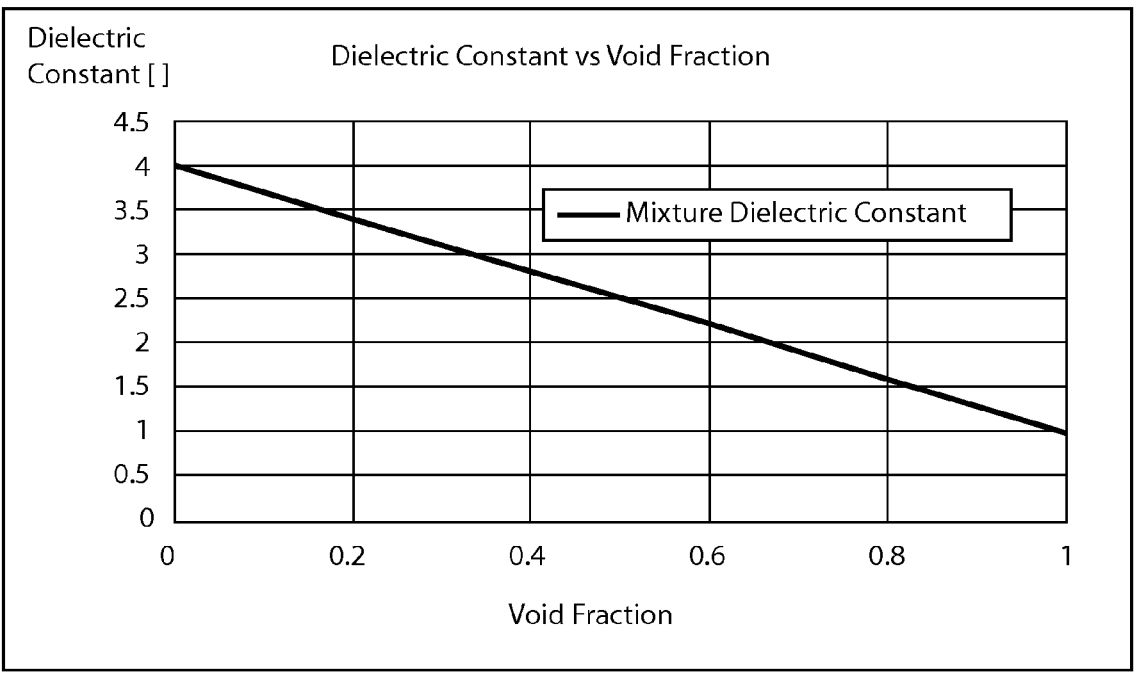
FIG. 13 is a graph of dielectric constant versus void fraction in an exemplary dielectric coolant in accordance with the present principles.

Referring now to FIG. 13, a graph is shown that illustrates the relationship between the void fraction on the horizontal axis and the dielectric constant on the vertical axis of a dielectric coolant.

Having described preferred embodiments of a system and method active control for two-phase cooling (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A cooling device, comprising:
   a cooling volume comprising:
   cavities; and
   active coolant flow controls in the cavities configured to adjust coolant flow through the cavities;
   a reservoir in fluid communication with the cavities;
   a two-phase coolant in the reservoir and the cavities, wherein the two-phase coolant has a phase transition temperature between an ambient temperature and an expected device temperature;
   a capacitance sensor configured to measure a capacitance of the coolant in the cavities; and
   a control module configured to determine a vapor quality and void fraction of the coolant based on the measured capacitance and to adjust the active coolant flow controls in response to the vapor quality and void fraction.

2. The cooling device of claim 1, wherein the control module is configured to increase coolant flow if the determined vapor quality and void fraction indicate a dry-out condition.

3. The cooling device of claim 1, wherein the reservoir comprises a liquid outlet and an inlet for a gas or a gas-liquid mixture.

4. The cooling device of claim 3, further comprising a pump configured to pump liquid coolant from the reservoir into the cavities.

5. The cooling device of claim 4, wherein the pump is embedded in the device.

6. The cooling device of claim 1, wherein the cavities comprise a wicking material.

7. The cooling device of claim 1, wherein the cooling device is a single, field-replaceable unit.

* * * * *